(12) United States Patent
Hashimoto et al.

(10) Patent No.: US 6,774,657 B2
(45) Date of Patent: Aug. 10, 2004

(54) APPARATUS AND METHOD OF INSPECTING SEMICONDUCTOR INTEGRATED CIRCUIT

(75) Inventors: Osamu Hashimoto, Tokyo (JP); Masaaki Tanimura, Tokyo (JP)

(73) Assignee: Renesas Technology Corp., Tokyo (JP)

(*) Notice: Subject to any disclaimer, the term of this patent is extended or adjusted under 35 U.S.C. 154(b) by 0 days.

(21) Appl. No.: 09/730,750

(22) Filed: Dec. 7, 2000

(65) Prior Publication Data

US 2001/0050569 A1 Dec. 13, 2001

(30) Foreign Application Priority Data

Jun. 9, 2000 (JP) .................................... 2000-173471

(51) Int. Cl.$^7$ .......................... G01R 31/02; G01R 31/26
(52) U.S. Cl. ...................... 324/765; 324/754; 324/763; 324/158.1
(58) Field of Search ................................ 324/765, 754, 324/158.1, 757, 758, 763, 761, 762; 714/719, 724

(56) References Cited

U.S. PATENT DOCUMENTS

| | | | |
|---|---|---|---|
| 4,801,871 A | * | 1/1989 | Tada et al. ............... 324/158.1 |
| 5,387,861 A | | 2/1995 | Neiderhofer |
| 5,537,051 A | | 7/1996 | Jalloul et al. |
| 5,831,441 A | | 11/1998 | Motooka et al. |
| 5,854,558 A | * | 12/1998 | Motooka et al. ............ 324/754 |
| 6,100,585 A | * | 8/2000 | Chiba ........................ 257/734 |

FOREIGN PATENT DOCUMENTS

| | | |
|---|---|---|
| DE | 44 33 906 | 3/1995 |
| DE | 195 15 154 | 5/1997 |
| EP | 0 405 765 | 1/1991 |
| JP | 6-58987 | 3/1994 |
| JP | 6-174786 | 6/1994 |

* cited by examiner

*Primary Examiner*—Kamand Cuneo
*Assistant Examiner*—Jimmy Nguyen
(74) *Attorney, Agent, or Firm*—McDermott, Will & Emery

(57) ABSTRACT

Versatility of an inspection apparatus suitable for use in a burn-in inspection operation is improved so as to enable inspection of various semiconductor integrated circuits. A plurality of relay pins which are electrically connected to wiring patterns laid on a base board are provided. Sockets for receiving a semiconductor integrated circuits are mounted on a base board. An exchange board is provided for electrically connecting socket terminals of the socket to specific relay pins. The exchange board is mounted on the base board via spacers. In accordance with the type of semiconductor integrated circuits, the exchange board and the socket are replaced.

11 Claims, 6 Drawing Sheets

APPARATUS AND METHOD OF INSPECTING SEMICONDUCTOR INTEGRATED CIRCUIT

BACKGROUND OF THE INVENTION

1. Field of the Invention

The present invention relates to an apparatus and method of inspecting a semiconductor integrated circuit, and more particularly, to an inspection apparatus and method suitable for use in burn-in inspection.

2. Description of the Background Art

In order to reveal defects which would lead to initial failures, a burn-in inspection or a like inspection is performed during processes. A burn-in inspection apparatus is equipped with a burn-in board on which a plurality of semiconductor integrated circuits are to be placed. A plurality of sockets are provided on the surface of the burn-in board so that semiconductor integrated circuits can be provided on the plurality of sockets. Semiconductor integrated circuits to be connected to the corresponding sockets are electrically connected to the main unit of the inspection apparatus by way of terminals of the sockets or by way of wiring patterns provided on the burn-in board.

Sockets provided on the burn-in board must be prepared for each semiconductor integrated circuit package. In a case where semiconductor integrated circuit packages of different types must be inspected, a burn-in board must be prepared for each of the semiconductor integrated circuit packages.

Even in a case where semiconductor integrated circuit packages of the same type are inspected, if functions assigned to pins are not unified and if the packages cannot be properly inspected by means of changing settings of the main unit of the inspection apparatus, identical burn-in packages cannot be used. Therefore, in such a case, there must be prepared a burn-in board designed specifically for each of the semiconductor integrated circuits of the same package.

For example, Japanese Patent Laid-Open No. Hei 6-58987 describes a technique of making a burn-in board suitable for use with a plurality of semiconductor integrated circuits of different types. The technique is intended for enabling a single burn-in board to be used with semiconductor integrated circuits which differ from each other in terms of configuration of a power pin and a GND pin.

FIG. 10 is a perspective view showing a portion of a burn-in board described in the foregoing patent document. A plurality of sockets 3, each receiving a semiconductor integrated circuit 2, are provided on the surface of a burn-in board 1 (FIG. 10 shows one of the sockets 3). The socket 3 has socket terminals 4 corresponding to a plurality of terminals of the semiconductor integrated circuit 2.

The burn-in board 1 has through holes corresponding to the respective socket terminals 4. The socket 3 is placed such that the socket terminals 4 project to the underside of the burn-in board 1. A relay pin 5 is provided on the underside of the burn-in board 1 so as to communicate with a power line pattern or a GND pattern laid on the burn-in board 1.

An exchange board 6 is attached to the underside of the burn-in board 1. On the surface of the exchange board 6, there is provided a wiring pattern 9 for interconnecting the through holes (including through hole 7) corresponding to the socket terminals 4 with a through hole 8 corresponding to the relay pin 5, and for interconnecting a specific through hole 7 and the through hole 8 corresponding to the relay pin 5.

The socket terminal 4 inserted into a specific through hole 7 is electrically connected to the relay pin 5 inserted in the through hole 8, by means of the exchange board 6 being attached to the burn-in board 1. In other words, when the exchange board 6 is attached to the burn-in board 1, among the terminals of a semiconductor integrated circuit, a terminal corresponding to the through hole 7 is electrically connected, by way of the exchange board 6, to a power line pattern or a GND pattern provided on the burn-in board. Accordingly, the structure of the burn-in board 1 shown in FIG. 10 enables use of a single burn-in board with semiconductor integrated circuits 2 of different types having different configurations of a power pin or a GND pin, by means of appropriately replacing the exchange board 6.

A burn-in inspection apparatus having the function of inspecting a semiconductor integrated circuit has recently been used. Such an inspection apparatus is required to establish an electrical connection between a signal pin of the semiconductor integrated circuit and the burn-in inspection apparatus, as well as between the burn-in inspection apparatus and a power pin or a GND pin of a semiconductor integrated circuit. In a case where a plurality of semiconductor integrated circuits have different signal pin configurations, a burn-in board must take care a difference in signal pin configuration between the semiconductor integrated circuits.

FIGS. 11A and 11B are illustrations for describing cases where the conventional technique is used for inspecting two semiconductor integrated ICs 1 and 2, which differs from each other in terms of configuration of a power pin, a GND pin, and signal pins. For the sake of brevity, the burn-in board 1 and the socket 3 are omitted from these drawings.

In the cases shown in FIGS. 11A and 11B, through holes 8 are formed so as to correspond to all terminals of the ICs 1 and 2. All the terminals of the IC 1 are electrically connected, by way of an exchange board 6A, to the wiring pattern laid on the burn-in board 1. Further, all the terminals of the IC 2 are electrically connected, by way of an exchange board 6B, to the wiring pattern laid on the burn-in board 1. In this case, there may be a case where the exchange boards 6A and 6B are required to assume complicated wiring structures in order to achieve desired electrical connections. In these examples, as shown in FIG. 11B, the exchange board 6B requires complicated cross wiring.

The cross wiring such as that shown in FIG. 11B can be achieved by means of forming the exchange board 6B in the form of a multi-layer wiring board, or by stacking a plurality of single layers in the form of the exchange board 6B. However, use of a multi-layer wiring board or stacking of single layers cancels benefits which would be yielded by rendering the burn-in board 1 versatile. Thus, the practical significance of realization of a versatile burn-in board is lessened.

The previously described conventional technique requires formation of through holes for the socket terminals 4 in the burn-in board 1 and placing the relay pin 5 in the socket 3. Thus, according to the conventional technique, each of the semiconductor integrated circuits requires on the burn-in board 1 a large occupational area. As a result, the number of semiconductor integrated circuits which can be mounted on a single burn-in board is decreased.

According to the conventional technique, through holes are formed in the burn-in board 1 specifically for each socket 3. Accordingly, a single burn-in board 1 cannot be used commonly for a plurality of sockets. Thus, a single burn-in board 1 cannot be used by a wide range of semiconductor integrated circuits.

In addition to the foregoing problem, the conventional technique encounters a problem of difficulty in using a single burn-in board for semiconductor integrated circuits of different word-bit configurations. Alternatively, it becomes difficult to ensure a space for a bypass capacitor for eliminating noise arising in a power line pattern or a GND pattern or the like.

SUMMARY OF THE INVENTION

The present invention has been conceived to solve the foregoing drawbacks of the background art and is aimed at providing a highly-versatile inspection apparatus which can be used with various types of semiconductor integrated circuits.

The present invention is also aimed at providing a method of inspecting a semiconductor integrated circuit using an inspection apparatus having the foregoing characteristics.

The above objects of the present invention are achieved by an inspection apparatus for inspecting a plurality of semiconductor integrated circuits mounted on a base board. The apparatus includes a plurality of relay pins electrically connected to a wiring pattern laid on the base board. Sockets each housing a semiconductor integrated circuit are provided on the base board. The apparatus also includes exchange boards, each electrically connecting socket terminals of a socket to a specific relay pin. There are interposed spacers between each of the exchange boards and the base board.

The above objects of the present invention are achieved by an inspection apparatus for inspecting a plurality of semiconductor integrated circuits mounted on a base board. The base board includes a plurality of connection terminals electrically connected to terminals of an inspection main unit as well as a plurality of wiring patterns connected to terminals of a semiconductor integrated circuit. A junction unit for changing the state of a junction formed between the connection terminals and the wiring pattern is provided.

The above objects of the present invention are achieved by an inspection method for inspecting a semiconductor integrated circuit using the inspection apparatus described above.

Other objects and further features of the present invention will be apparent from the following detailed description when read in conjunction with the accompanying drawings.

DESCRIPTION OF THE PREFERRED EMBODIMENTS

Figure 1:
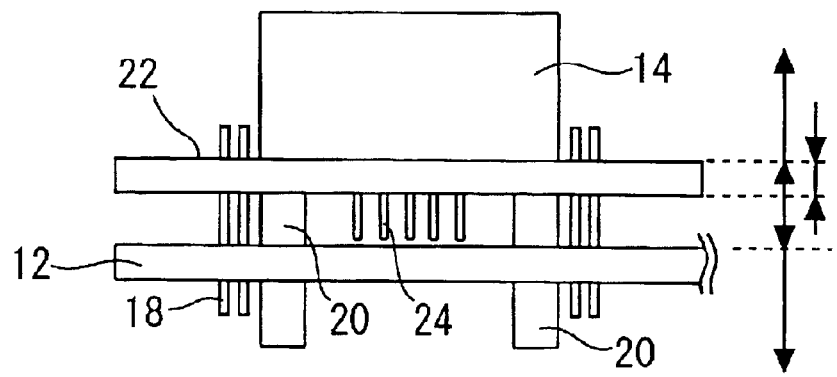
FIG. 1 shows a primary section of a burn-in inspection apparatus for a semiconductor integrated circuit according to a first embodiment of the present invention.

In the following, principles and embodiments of the present invention will be described with reference to the accompanying drawings. The members and steps that are common to some of the drawings are given the same reference numerals and redundant descriptions therefor may be omitted.

First Embodiment

Figure 2:
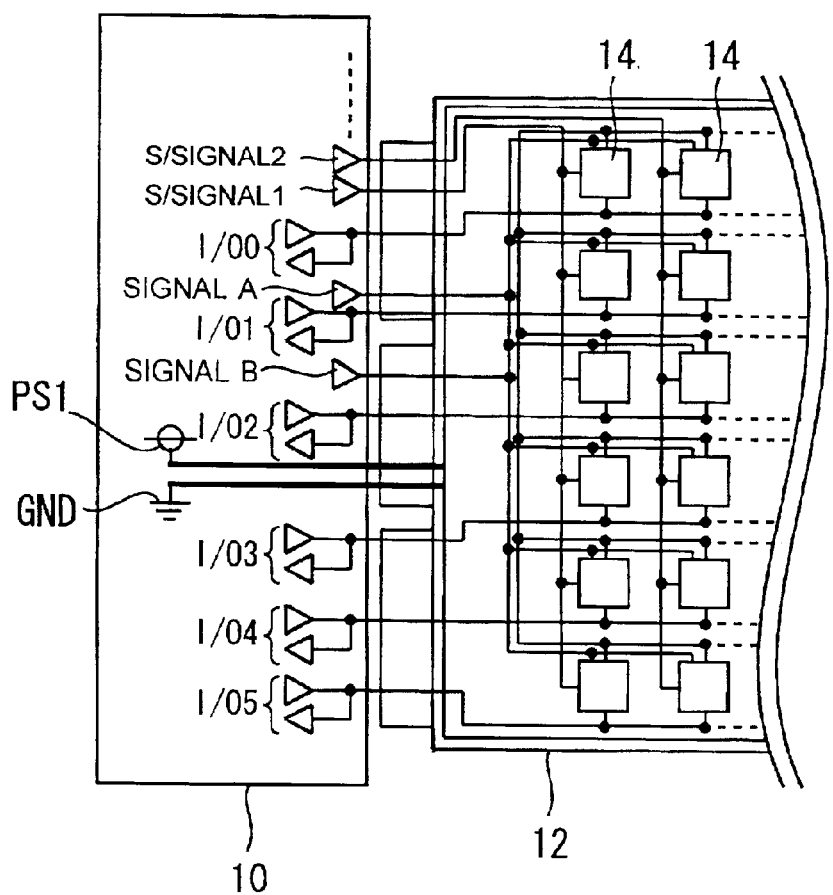
FIG. 2 is a schematic drawing for describing the overall configuration of the burn-in inspection apparatus according to the first embodiment.

FIG. 1 shows the primary section of a burn-in inspection apparatus for a semiconductor integrated circuit according to a first embodiment of the present invention. FIG. 2 is a schematic drawing for describing the entire configuration of the burn-in inspection apparatus according to the first embodiment. A burn-in inspection apparatus according to the present embodiment has the function of inspecting the operation of a semiconductor integrated circuit. In addition to effecting an ordinary burn-in operation, the burn-in inspection apparatus can evaluate a semiconductor integrated circuit as non-defective or defective.

As shown in FIG. 2, the burn-in inspection apparatus comprises an inspection main unit 10 and a burn-in board 12. The inspection main unit 10 is equipped with a plurality of selection signal terminals (including terminals for selection signals 1 and 2), a plurality of I/O terminals (including I/O0 through I/O5 terminals), a plurality of signal terminals (including terminals for signals A and B), a power terminal PSI, and a ground terminal GND.

A plurality of sockets 14, each containing a semiconductor integrated circuit, are provided on the burn-in board 12. The sockets 14 are arranged in predetermined numbers in a row (vertical direction) and a column (horizontal direction). In the case of the burn-in inspection apparatus shown in FIG. 2, a selection signal is set for each row. For instance, a selection signal 1 is supplied to all the sockets 14 belonging to a left row shown in FIG. 2. Terminals I/O0 through I/O5 are set for respective columns. For example, a terminal I/O0 is connected to all the sockets 14 belonging to the top column shown in FIG. 2. Further, the terminals for signals A and B are connected to all the sockets 14.

In the present embodiment, as mentioned above, a single I/O terminal is connected to all the sockets 14 belonging to a single column. In other words, all semiconductor integrated circuits belonging to a single column are connected to a single I/O terminal. In order to prevent signals output from semiconductor integrated circuits from colliding within a signal line connected to the I/O terminal, the inspection apparatus of the present embodiment inspects a plurality of semiconductor integrated circuits, by means of scanning each of rows through use of a selection signal. According to this method, individual semiconductor integrated circuits can be accurately inspected while a costly I/O terminal equipped with a comparator can be shared among a plurality of semiconductor integrated circuits.

The inspection apparatus according to the present embodiment requires setting of semiconductor integrated circuits on the burn-in board 12 by way of the sockets 14 and connecting of terminals of respective semiconductor integrated circuit to various terminals of the inspection main unit 10 by way of the burn-in board 12. Various types of semiconductor integrated circuit packages exist. Therefore, the sockets 14 must be changed according to the types of packages. Functions assigned to individual pins of a semiconductor integrated circuit are determined on a per-product basis. Accordingly, wiring for interconnecting the terminals of semiconductor integrated circuits and the terminals of the inspection main unit 10 must be determined for each semiconductor integrated circuit.

As mentioned above, assuming that various types of semiconductor integrated circuits are to be objects of inspection, the burn-in board 12 is required to have a high degree of flexibility in terms of the types of sockets 14 and wiring structures. The inspection apparatus according to the present embodiment has achieved flexibility and versatility for inspecting various types of semiconductor integrated circuits, by means of forming the burn-in board 12 so as to assume a structure shown in FIG. 1.

As shown in FIG. 1, a plurality of relay pins 18 are inserted in the burn-in board 12. More specifically, the relay pins 18 are provided in equal number with the terminals of semiconductor integrated circuits which are objects of inspection. The relay pins 18 are soldered to corresponding through holes formed in the burn-in board 12. Individual through holes are electrically connected to various terminals provided in the inspection main unit 10 (see FIG. 2). Accordingly, the relay pins 18 are electrically connected to the plurality of terminals provided in the inspection main unit 10.

An exchange board 22 is placed on the burn-in board 12 by way of spacers 20. In the present embodiment, a space equal to the height of the spacers 20 is ensured between the burn-in board 12 and the exchange board 22. The relay pins 18 extending from the burn-in board 12 are inserted into the exchange board 22 as well, being soldered to through holes formed in the exchange board 22.

A socket 14 is placed on the exchange board 22 and has a plurality of socket terminals corresponding to terminals of a semiconductor integrated circuit housed in the socket 14. The socket terminals 24 are soldered to the through holes formed in the exchange board 22.

On the exchange board 22, there is provided a wiring pattern for electrically connecting the through holes to be soldered to the socket terminals 24 with the through holes to be soldered to the relay pins 18. In the case of the structure of the burn-in board 12 shown in FIG. 1, specific socket terminals 24 are electrically connected to specific relay pins 18. Further, the socket terminals 24 are electrically connected to specific terminals of the inspection main unit 10 (see FIG. 2), by way of the relay pins 18 and the burn-in board 12.

In the structure of the burn-in board 12 shown in FIG. 1, so long as the solder joints formed between the relay pins 18 and the exchange board 22 are removed, the exchange board 22 can be removed from the burn-in board 12 without inflicting any damage to the burn-in board 12. In other words, the structure of the burn-in board 12 according to the present embodiment enables easy replacement of the exchange board 22 and the socket 14 without inflicting damage to the burn-in board 12. Unless pins of a semiconductor integrated circuit outnumbers the relay pins 18, the inspection apparatus according to the present embodiment can use a single burn-in board 12 for inspecting a wide range of semiconductor integrated circuit packages, without regard to any difference in package or pin configuration. Further, the spacers 20 may be mounted on the exchange board 22 and may be replaced together with the exchange board 22. Alternatively, it may be the case that the spacers 20 are mounted on the burn-in board 12 and are not replaced at the time of replacement of the exchange board 22.

The structure of the burn-in board 12 shown in FIG. 1 enables removal of the socket 14 from the exchange board 22 by means of removing solder joints formed between the socket terminals 24 and the exchange board 22. So long as semiconductor integrated circuit packages of the same type are inspected, the socket 14 can house various types of semiconductor integrated circuits without regard to a difference in pin configurations of the packages. In a case where the thus-removed socket 13 is attached to another exchange board 22 and the exchange board 22 is mounted on the burn-in board 12, sockets 14 of the same type can be shared among various types of semiconductor integrated circuits having packages of the same type.

The structure of the burn-in board 12 according to the present embodiment obviates a necessity for forming in the burn-in board 12 through holes through which the socket terminals 24 penetrate. In the present embodiment, an occupation area ensured on the burn-in board 12 for setting a single semiconductor integrated circuit can be made comparatively small. Accordingly, the structure of the burn-in board 12 according to the present embodiment enables setting of a plurality of semiconductor integrated circuits on a single burn-in board 12 and efficient inspection of the semiconductor integrated circuits.

Further, in the structure of the burn-in board 12 according to the present embodiment, a space is ensured between the burn-in board 12 and the exchange board 22 by means of the spacers 20. Providing a bypass capacitor on a power line pattern or a GND pattern is effective for eliminating noise which would otherwise be superimposed on the power line pattern or the GND pattern. According to the present embodiment, a bypass capacitor can be placed in the space defined between the burn-in board 12 and the exchange board 22. In this respect, the structure of the burn-in board 12 according to the present embodiment is effective for diminishing noise which arises in an inspection process and for improving inspection accuracy.

In the present embodiment, connection between the relay pin 18 and the burn-in board 12, connection between the relay pin 18 and the exchange board 22, and connection between the exchange board 22 and the socket terminals 24 are realized by means of soldering. However, these connections are not limited to soldering. For instance, pin sockets may be used for holding the relay pins 18 or the socket terminals 24.

In a case where the burn-in board 12 holds the relay pins 18 through use of a pin socket, the relay pins 18 can be removed from the burn-in board 12 without inflicting damage on the burn-in board 12. In this case, the relay pins 18 may be taken as exchange components along with the exchange board 22 and the socket 14.

In the present embodiment, the relay pins 18 are located outside the socket 14. However, the layout of relay pins 18 is not limited to such a configuration. For example, the relay pins 18 may be located immediately below the socket 14. In this case, in contrast with a case where the relay pins 18 are placed outside the socket 14, such a configuration can achieve superior space efficiency.

Second Embodiment

A second embodiment of the present invention will now be described by reference to FIGS. 3 and 4.

Figure 3:
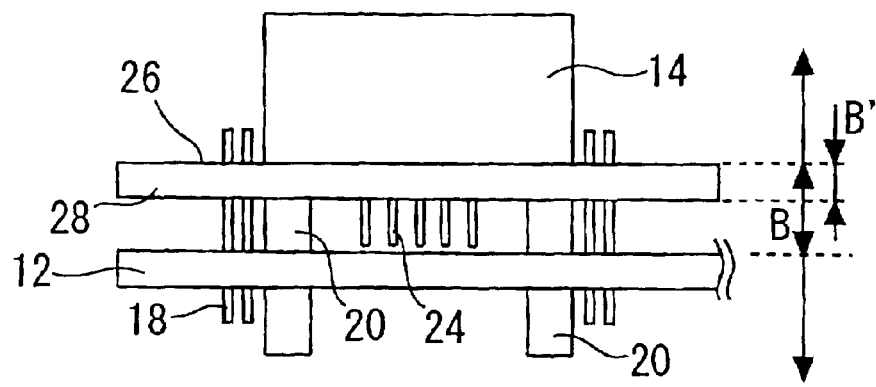
FIG. 3 is an illustration for describing the principal section of a burn-in inspection apparatus according to a second embodiment of the present invention.

FIG. 3 is an illustration for describing the principal section of a burn-in inspection apparatus according to the second embodiment. The inspection apparatus according to the present embodiment is identical with that described in connection with the first embodiment, except that a film-like sheet board 26 and a reinforcement plate 28 are provided in lieu of the exchange board 22 shown in FIG. 1.

Figure 4A:
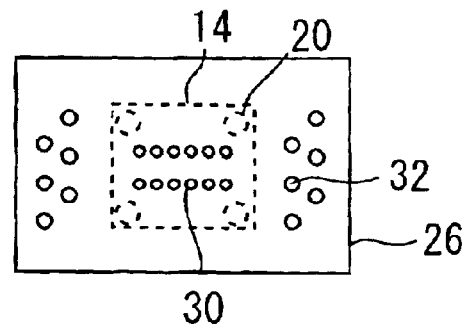
FIG. 4A is a plan view showing a sheet-like board shown in FIG. 3.
Figure 4B:
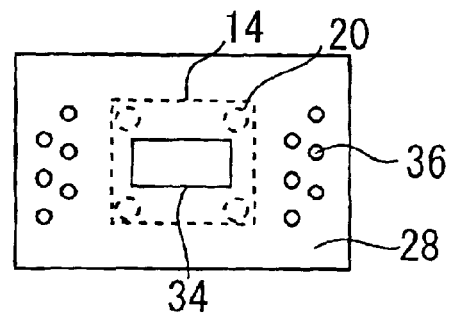
FIG. 4B is a plan view showing a reinforcement plate 28 shown in FIG. 3.
Figure 4C:
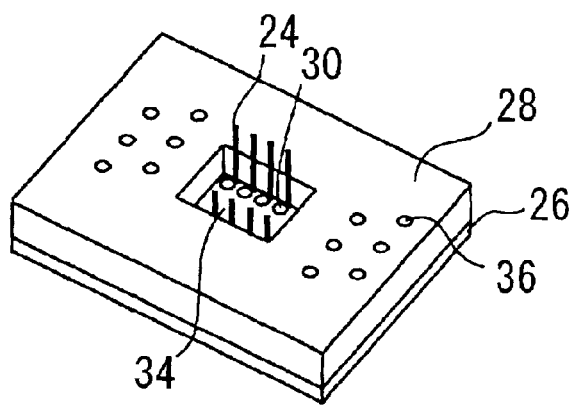
FIG. 4C is a perspective view showing a unit into which a socket, the sheet-like board, and the reinforcement plate shown in FIG. 3 are assembled, when viewed from the reinforcement plate.

FIG. 4A is a plan view showing the sheet-like board 26, and FIG. 4B is a plan view showing the reinforcement plate 28. FIG. 4C is a perspective view showing a unit into which the socket 14, the sheet-like board 26, and the reinforcement plate 28 are assembled, when viewed from the reinforcement plate 28. In FIGS. 4A and 4B, rectangular areas designated by broken lines depict areas in which the socket 14 is to be placed. Further, circles designated by broken lines depict areas in which the spacers 20 are to be placed.

As shown in FIG. 4A, through holes 30 are formed in the sheet-like board 26 for establishing electrical connection with the socket terminals 24. Further, through holes 32 are formed in the sheet-like board 26 for establishing electrical connection with the relay pins 18. As shown in FIG. 4B, in the reinforcement plate 28 there are formed an opening 34 for avoiding interference, which would otherwise arise between the socket terminal 24 and the reinforcement plate 28, and through holes 36 through which the relay pins 18 penetrate. As shown in FIG. 4C, the socket terminals 24 can pass through to the underside of the reinforcement plate 28 by way of the opening 34.

In the present embodiment, a wiring pattern analogous to that provided on the exchange board 22 according to the first embodiment is provided on the sheet-like board 26. The relay pins 18 and the socket terminals 24 are electrically connected to the through holes 30 and 32 formed in the sheet-like board 26, by means of soldering or engagement. Accordingly, as in the case of the first embodiment, the structure of the burn-in board 12 according to the present embodiment enables establishment of electrical connection between specific terminals of a semiconductor integrated circuit and specific terminals of the inspection main unit 10.

In the present embodiment, so long as the socket terminal 24 is situated within the opening 34, the reinforcement plate 28 can be widely used with various sockets 14; that is, various types of semiconductor integrated circuits. In the present embodiment, replacement of only the sheet-like board 26 and the socket 14 enables the inspection apparatus to inspect a wide variety of semiconductor integrated circuits. Accordingly, the structure of the burn-in inspection apparatus renders exchange parts less costly than those of the burn-in inspection apparatus according to the first embodiment.

Third Embodiment

A third embodiment of the present invention will now be described by reference to FIGS. 5 through 9.

Figure 5:
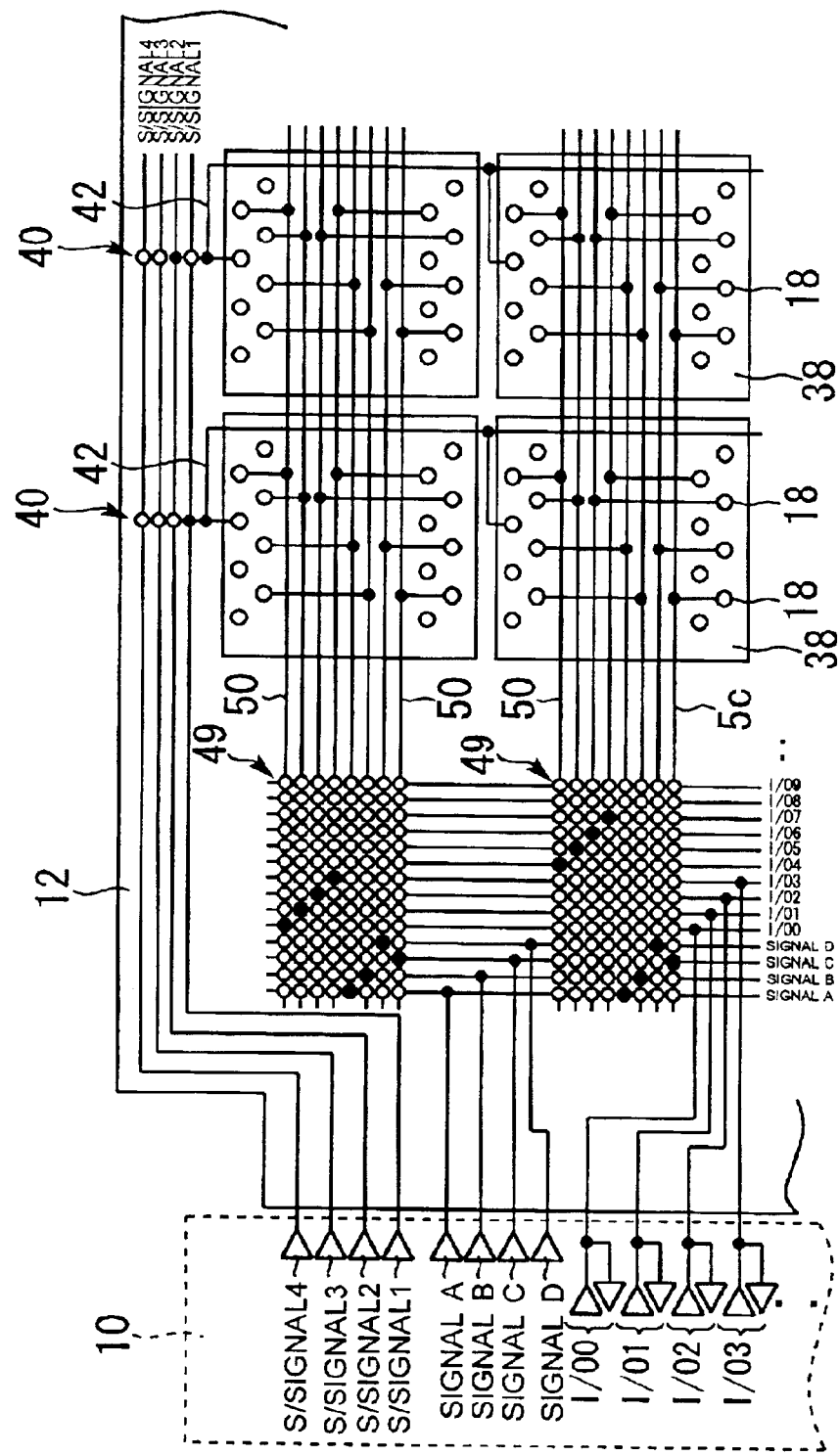
FIG. 5 is a schematic diagram for describing a characteristic configuration of a burn-in inspection apparatus according to a third embodiment of the present invention.

FIG. 5 is a schematic diagram for describing the characteristic configuration of the burn-in inspection apparatus according to the third embodiment. As shown in FIG. 5, the inspection main unit 10 is equipped with terminals for producing selection signals 1 through 4, terminals for producing signals A through D, and a plurality of I/O terminals (including I/O0 through I/O3).

Selection signals 1 through 4 are intended to activate a plurality of semiconductor integrated circuits arranged on the burn-in board 12, on a per-row basis. Signals A through D are to be supplied to all the semiconductor integrated circuits. An I/O terminal is to be shared among a plurality of semiconductor integrated circuits arranged in a column on the burn-in board 12.

In FIG. 5, a region 38 formed on the burn-in board 12 is a circuit mount region assigned to one semiconductor integrated circuit. In the present embodiment, a junction unit 40 is provided for each row of circuit mount regions 38 on the burn-in board 12. A wiring pattern 42 connected to specific relay pins 18 of all the circuit mount regions 38 belonging to each row is electrically connected to each of the junction units 40. Each junction unit 40 is arranged so as to be able to transfer an arbitrary one of the selection signals 1 through 4 to the wiring pattern 42.

Figure 6:
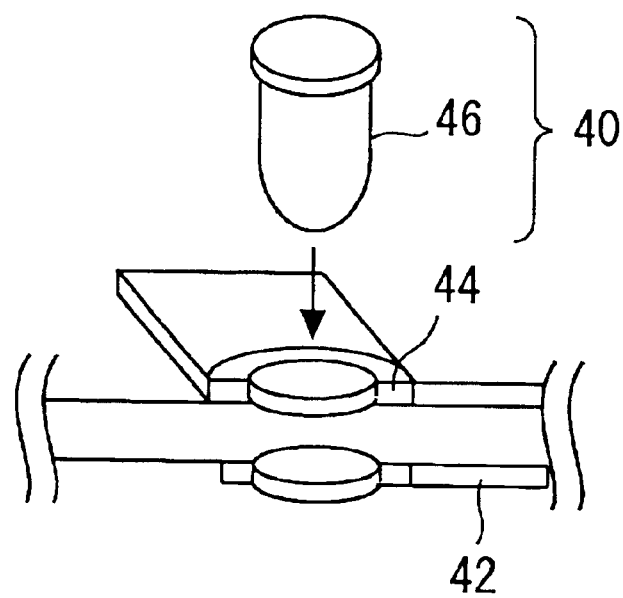
FIG. 6 is an illustration for describing an example of a junction unit included in the burn-in inspection apparatus shown in FIG. 5.

FIG. 6 is an illustration for describing the structure of the junction unit 40 in more detail. More specifically, FIG. 6 is a cross-sectional perspective view showing a pin socket 44 of the junction unit 40. The junction unit 40 has four pin sockets 44 which are shown in FIG. 6 and are assigned to the respective selection signals 1 through 4. In a case where the pin 46 is inserted into the pin socket 44, the pin socket 44 transfers the corresponding signal from among selection signals 1 through 4 to the wiring pattern 42. Accordingly, in the present embodiment, a desired selection signal can be led to a specific relay pin 18 provided in the circuit mount region 38, by means of inserting the pin 46 into the pin socket 44 corresponding to the desired selection signal.

Figure 7:
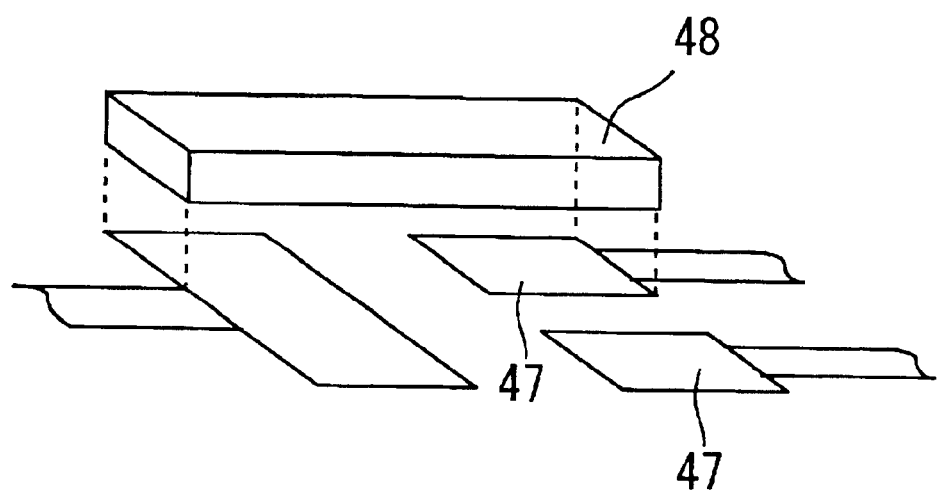
FIG. 7 is an illustration for describing another example of the junction unit included in the burn-in inspection apparatus shown in FIG. 5.

A method of connecting an arbitrary one of a plurality of signal paths to the relay pin 18 is not limited to use of the pin socket 44. As shown in FIG. 7, electrical connection of only an arbitrary signal path to the relay pin 18 can be accomplished by means of placing a short-circuit element 48 in only a portion of a plurality of element mount patterns 47. Alternatively, a dipswitch is provided at any point on a signal path, and electrical connection of only a desired signal path to the relay pin 18 may be accomplished by means of changing the state of the dipswitch, as required.

As mentioned above, by adoption of an appropriate junction structure, there can be accomplished transfer of only a desired signal of a plurality of selection signals to a specific relay pins of all the circuit mount regions 38 belonging to a row. Accordingly, the inspection apparatus of the present embodiment can readily take a specific relay pin 18 as a pin corresponding to a desired selection signal.

Junction units 49 are provided on the burn-in board 12 so as to correspond to respective columns of circuit mount regions 38. Each of the junction units 49 is electrically connected to a plurality of relay pins 18 of all the circuit mount regions 38 belonging to each column, by way of a plurality of wiring patterns 50. As in the case of the previously described junction unit 40, the junction unit 49 is arranged so as to supply a specific signal to an arbitrary wiring pattern 50 by adoption of an appropriate junction structure.

More specifically, the junction unit 49 is arranged so as to be able to transmit the signals A through D to arbitrary relay pins 18 of all the circuit mount regions 38. Further, respective I/O terminals can be electrically connected to arbitrary relay pins 18 of all the circuit mount regions 38 belonging to each column. Thus, the inspection apparatus according to the present embodiment enables an arbitrary relay pin 18 provided in the circuit mount region 38 to be readily taken as a pin corresponding to one of the signals A through D. Further, an arbitrary relay pin 18 provided in the circuit mount region 38 can be connected to I/O terminals provided for each column.

Figure 8A:
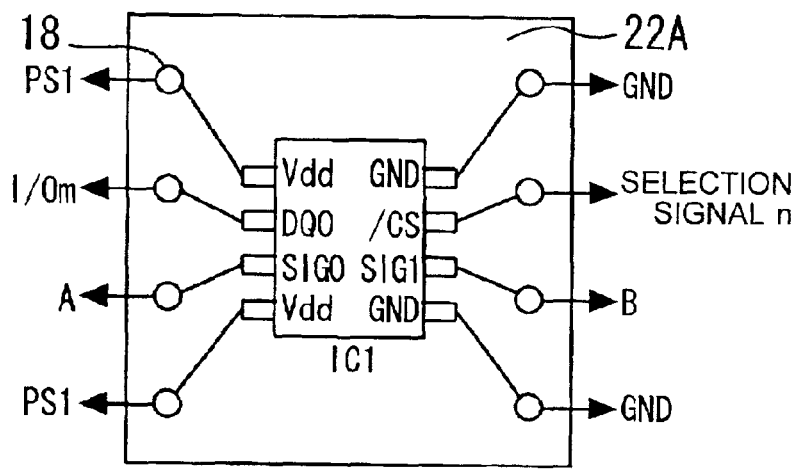
FIGS. 8A and 8B are illustrations for describing an advantage resulting from use of a burn-in board of a third embodiment of the present invention.
Figure 8B:
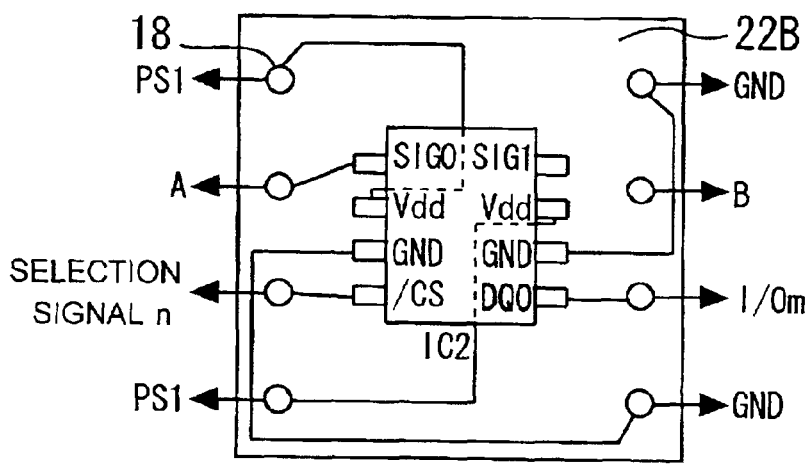

FIGS. 8A and 8B are illustrations for describing an advantage resulting from use of the burn-in board 12 shown in FIG. 5. More specifically, FIG. 8A is a plan view showing an IC 1 which is a first object of inspection and an exchange board 22A used for inspecting the IC 1. FIG. 8B is a plan view showing an IC 2 which is a second object of inspection and an exchange board 22B used for inspecting the IC 2. For the sake of brevity, the socket 14 is omitted from the drawings.

Figure 11A:
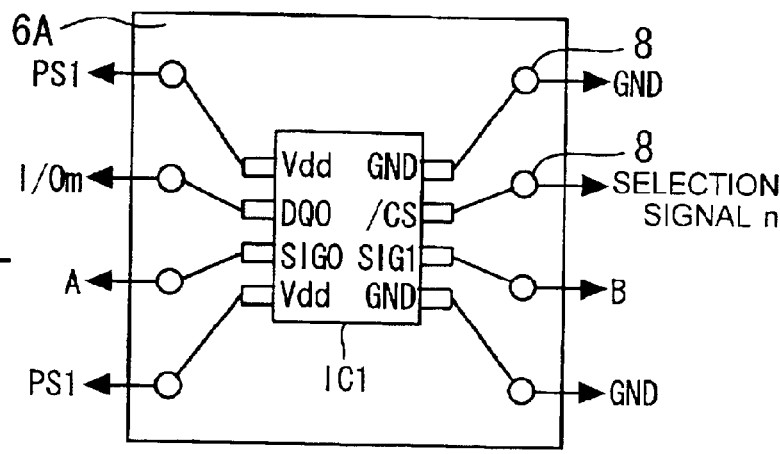
FIGS. 11A and 11B are plan views of exchange boards for describing a problem arising in the conventional burn-in inspection apparatus.
Figure 11B:
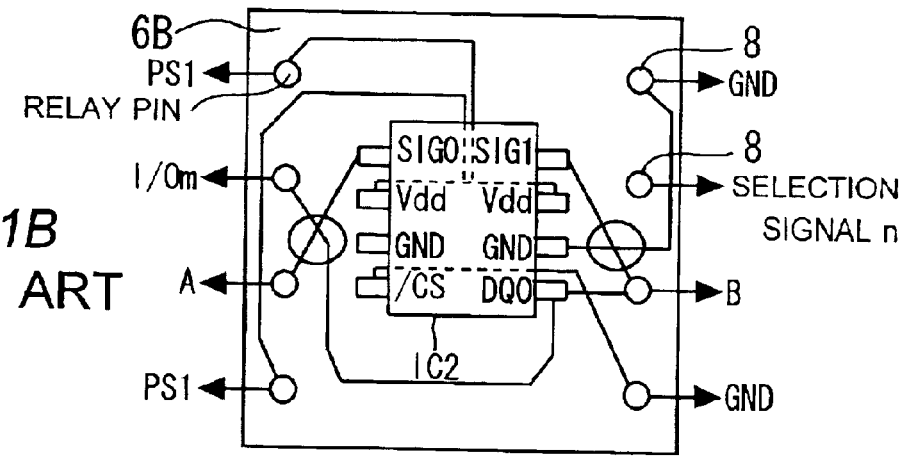

In the examples shown in FIGS. 8A and 8B, the relay pins 18 are provided so as to correspond to all the terminals of the IC 1 and those of the IC 2. Although the ICs 1 and 2 have the same packages, they differ greatly from each other in terms of pin configuration. Specifically, the ICs 1 and 2 differ from each other with regard to the position of a Vdd terminal (power supply terminal) and the position of a ground terminal GND. Further, the ICs 1 and 2 differ from each other with regard to all signal terminals (a /CS terminal, a SIG1 terminal, a SIG0 terminal, and a DQ0 terminal). In this case, if functions are fixedly assigned to respective relay pins 18, complicated cross wiring must be laid on the exchange board 22B (see FIG. 11B).

In the present embodiment, an arbitrary junction can be made on the burn-in board 12, and desired functions can be freely assigned to individual relay pins 18. As shown in FIGS. 8A and 8B, desired junctions can be formed on all terminals of the ICs 1 and 2 without involvement of formation of complicated cross wiring on the exchange boards 22A and 22B. In this respect, the inspection apparatus according to the present embodiment can make exchange components less costly than does the inspection apparatus according to the first embodiment or that according to the second embodiment.

Another exchange board 22C, which can be used with any one of the inspection apparatus according to the first through third embodiments, will now be described by reference to FIG. 9.

Figure 9:
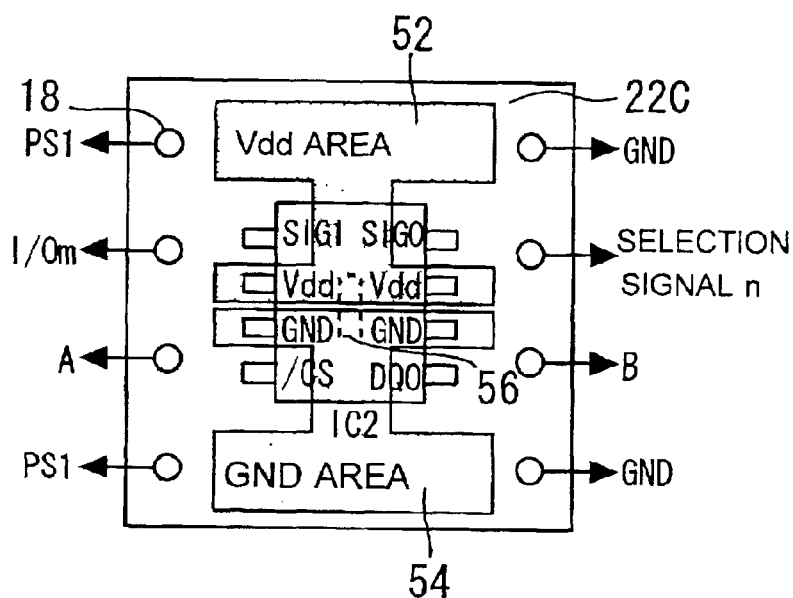
FIG. 9 is a perspective view of another exchange board usable in the first thorough third embodiment.
Figure 10:
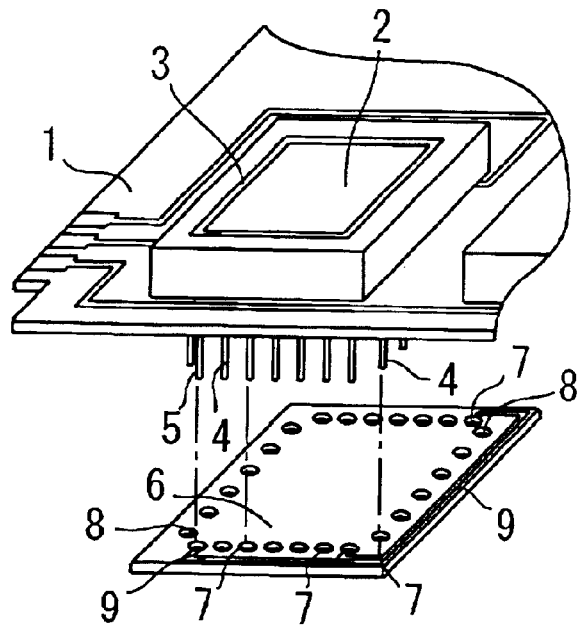
FIG. 10 shows a primary section of a conventional burn-in inspection apparatus.

FIG. 9 is a perspective view of the exchange board 22C. For the sake of brevity, the socket 14 for housing the IC 2 is omitted from the drawing.

The exchange board 22C has a multilayered structure, and a Vdd area 52 and a GND area 54 are provided in one of the layers. The Vdd area 52 is a wide conductive region of predetermined configuration. The Vdd area 52 is provided between the relay pin 18 for receiving a power supply voltage and a Vdd terminal of the IC 2. The GND area 54 is a wide conductive region of predetermined configuration and is provided between the grounded relay pin 18 and the ground terminal GND of the IC 2.

A bypass capacitor 56 is provided on the underside of the exchange board 22C; that is, the surface of the exchange board 22C opposing the burn-in board 12. As in the case of the first or second embodiment, the exchange board 22C is mounted on the burn-in board 12 byway of the spacers 20. Accordingly, the bypass capacitor 56 can be mounted on the underside of the exchange board 22C without involving interference between the burn-in board 12 and the exchange board 22C. By means of the functions of the Vdd area 52, the GND area 54, and the bypass capacitor 56, the exchange board 22C can effectively prevent occurrence of noise, which would otherwise be caused by variations in power current.

Although in the first through third embodiments an apparatus for inspecting a semiconductor integrated circuit is limited to a burn-in inspection apparatus, the present invention is not limited to the burn-in inspection apparatus and can be widely applied to any apparatus which inspects by a single operation a plurality of semiconductor integrated circuits provided on a base board.

Since the present invention has been configured as mentioned above, the present invention yields the following advantages.

According to a first aspect of the present invention, an exchange board and a socket are replaced, and a single base board can be used for inspecting a variety of types of semiconductor integrated circuits. At the time of removal and replacement of an exchange board from relay pins, the exchange board can be replaced without inflicting damage to a base board. Since the socket is mounted on the exchange board, the socket can be recycled without inflicting damage to the base board. There is no necessity for forming in the base board through holes for receiving socket terminals, and hence the space occupied by the base board can be effectively utilized. Space is ensured between the base board and the exchange board, and hence an element, such as a bypass capacity, can be provided in the space.

According to a second aspect of the present invention, a less costly sheet board can be used as an exchange board. Thus, the present invention can bring down the price of an exchange component.

According to a third aspect of the present invention, the exchange board supports relay pins through use of pin sockets, and hence removal of the exchange board can be performed readily.

According to a fourth aspect of the present invention, since the base board holds relay pins through use of pin sockets, relay pins can be removed from the base board without inflicting damage to the base board. Accordingly, the present invention enables replacement of replaceable elements including relay pins, without promoting deterioration of the base board.

According to a fifth aspect of the present invention, a circuit element, such as a bypass capacitor, can be mounted on the surface of the base board opposing an exchange board, by utilization of a space ensured by spacers.

According to a sixth aspect of the present invention, a circuit element, such as a bypass capacitor, can be mounted on the surface of an exchange board opposing the base board, by utilization of a space ensured by spacers.

According to a seventh aspect of the present invention, a junction unit can change a junction between a connection terminal connected to a terminal of an inspection main unit and a wiring pattern connected to the terminal of a semiconductor integrated circuit. In other words, a function assigned to a wiring pattern provided on a base board can be changed through use of a junction unit. Thus, the present invention can efficiently realize junctions corresponding to a word bit configuration of an individual semiconductor integrated circuit. Moreover, according to the present invention, in a case where an exchange board is mounted on a base board, the wiring pattern provided in the exchange board can be simplified.

According to an eighth aspect of the present invention, so long as pins are inserted into appropriate pin sockets, a desired junction can be established between a connection terminal and a wiring pattern.

According to a ninth aspect of the present invention, a short-circuit element is mounted on an element mount pattern appropriately, whereby a desired junction can be readily established between a connection terminal and a wiring pattern.

According to a tenth aspect of the present invention, the state of a junction established between a connection terminal and a wiring pattern can be readily changed to a desired state by means of appropriately changing the state of a dip switch.

According to a eleventh aspect of the present invention, various semiconductor integrated circuits can be efficiently inspected through use of an inspection apparatus of superior versatility.

Further, the present invention is not limited to these embodiments, but variations and modifications may be made without departing from the scope of the present invention.

The entire disclosure of Japanese Patent Application No. 2000-173471 filed on Jun. 9, 2000 including specification, claims, drawings and summary are incorporated herein by reference in its entirety.

What is claimed is:

1. An inspection apparatus for inspecting a plurality of semiconductor integrated circuits mounted on a base board, the apparatus comprising:
    a plurality of relay pins electrically connected to a wiring pattern laid on the base board;
    sockets provided on the base board, each housing a semiconductor integrated circuit;
    exchange boards, each electrically connecting socket terminals of a socket to a specific relay pin; and
    spacers interposed between each of the exchange boards and the base board.

2. The inspection apparatus according to claim 1, wherein the exchange board is a film-like sheet board, and a reinforcement plate for reinforcing the sheet-like board is provided between the sheet-like board and the spacers.

3. The inspection apparatus according to claim 1, wherein the exchange board is provided with a pin socket for holding the relay pins, and the relay pins are removably attached to the exchange board.

4. The inspection apparatus according to claim 1, wherein the base board has a pin socket for holding the relay pins, and the exchange board is removable from the base board together with the relay pins.

5. The inspection apparatus according to claim 1, wherein a circuit element or a pattern for receiving a circuit element is formed in an area on the base board, the area opposing the exchange board.

6. The inspection apparatus according to claim 1, wherein a circuit element or a pattern for receiving a circuit element is formed in an area on the exchange board, the area opposing the base board.

7. An inspection apparatus for inspecting a plurality of semiconductor integrated circuits mounted on a base board, wherein the base board comprises:
    a plurality of connection terminals electrically connected to terminals of an inspection main unit;
    a plurality of wiring patterns connected to terminals of a semiconductor integrated circuit; and
    a junction unit for changing the state of a junction formed between the connection terminals and the wiring pattern, wherein the junction unit includes a group of pin sockets each of which is interposed between each of a plurality of wiring patterns and a single connection terminal and/or a group of pin sockets each of which is interposed between each of a plurality of connection terminals and a single wiring pattern, each of said pin sockets connecting the wiring pattern to the connection terminal when a pin is inserted therein.

8. An inspection apparatus for inspecting a plurality of semiconductor integrated circuits mounted on a base board, wherein the base board comprises:
    a plurality of connection terminals electrically connected to terminals of an inspection main unit;
    a plurality of wiring patterns connected to terminals of a semiconductor integrated circuit; and
    a junction unit for changing the state of a junction formed between the connection terminals and the wiring pattern, wherein the junction unit includes an element mount pattern for connecting the wiring pattern to the connection terminals when a short-circuit element is mounted on the element mount pattern, and the element mount pattern is provided between each of a plurality of wiring patterns and a single connection terminal and/or between each of a plurality of connection terminals and a single wiring pattern.

9. An inspection apparatus for inspecting a plurality of semiconductor integrated circuits mounted on a base board, wherein the base board comprises:
    a plurality of connection terminals electrically connected to terminals of an inspection main unit;
    a plurality of wiring patterns connected to terminals of a semiconductor integrated circuit; and
    a junction unit for changing the state of a junction formed between the connection terminals and the wiring pattern, wherein the junction unit includes at least one of a dip switch for switching a junction between each of a plurality of wiring patterns and a single connection terminal, and a dip switch for switching a junction between a plurality of connection terminals and a single wiring pattern.

10. An inspection method for inspecting a semiconductor integrated circuit using the inspection apparatus according to claim 1.

11. The inspection apparatus according to claim 9 wherein the junction unit includes a pin socket for connecting the wiring pattern to the connection terminals when a pin is inserted into the pin socket, and the pin socket is interposed between each of a plurality of wiring patterns and a single connection terminal and/or between each of a plurality of connection terminals and a single wiring pattern.

* * * * *